United States Patent
Liu et al.

(10) Patent No.: US 8,429,592 B2
(45) Date of Patent: Apr. 23, 2013

(54) N/P CONFIGURABLE LDMOS SUBCIRCUIT MACRO MODEL

(75) Inventors: Yong Liu, Murphy, TX (US); Keith R. Green, Prosper, TX (US); Marie Denison, Plano, TX (US); Yizhong Xie, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 14 days.

(21) Appl. No.: 13/277,932

(22) Filed: Oct. 20, 2011

(65) Prior Publication Data

US 2012/0102443 A1 Apr. 26, 2012

Related U.S. Application Data

(60) Provisional application No. 61/394,824, filed on Oct. 20, 2010.

(51) Int. Cl.
*G06F 17/50* (2006.01)

(52) U.S. Cl.
USPC .............. 716/136; 716/115; 716/132; 703/14

(58) Field of Classification Search ........................ None
See application file for complete search history.

(56) References Cited

U.S. PATENT DOCUMENTS

| | | | |
|---|---|---|---|
| 7,983,889 B2* | 7/2011 | Miura et al. ................. | 703/14 |
| 2010/0241413 A1* | 9/2010 | Liu et al. ...................... | 703/14 |
| 2011/0074493 A1* | 3/2011 | Denison et al. .............. | 327/536 |

OTHER PUBLICATIONS

Marie Denison et al., "Investigation of a Dual Channel N/P-LDMOS and Applciation to LDO Linear Voltage Regulation," 2010 IEEE, pp. 277-280.*

S. Reggiani et al., "Theoretical Analysis of the Vertical LOCOS DMOS Transistor with Process-induced Stress Enhancement," 2009 IEEE, 4 pages.*

\* cited by examiner

*Primary Examiner* — Leigh Garbowski

(74) *Attorney, Agent, or Firm* — Wade J. Brady, III; Frederick J. Telecky, Jr.

(57) ABSTRACT

A process of operating a computer system to create a subcircuit model of an N/P configurable extended drain MOS transistor in which the subcircuit model includes an npn bipolar transistor and a pnp bipolar transistor which correspond to current paths through n-channel drift lanes and p-channel drift lanes during dual mode operation. A process of operating a computer system to simulate the behavior of an electronic circuit including a N/P configurable extended drain MOS transistor in which a subcircuit model of the N/P configurable extended drain MOS transistor includes an npn bipolar transistor and a pnp bipolar transistor which correspond to current paths through n-channel drift lanes and p-channel drift lanes during dual mode operation. A computer readable medium storing an electronic circuit simulation program that generates a simulation output of the behavior of an electronic circuit including a N/P configurable extended drain MOS transistor.

15 Claims, 5 Drawing Sheets

N/P CONFIGURABLE LDMOS SUBCIRCUIT MACRO MODEL

CROSS-REFERENCE TO RELATED APPLICATIONS

This application claims the benefit of U.S. Provisional Application No. 61/394,824, filed Oct. 20, 2010, the entirety of which is herein incorporated by reference. This application is also related to U.S. application Ser. No. 12/883,726, filed Sep. 16, 2010, the entirety of which is herein incorporated by reference.

FIELD OF THE INVENTION

More particularly, this invention relates to simulation of integrated circuits containing N/P configurable extended drain MOS transistors.

BACKGROUND OF THE INVENTION

An integrated circuit may contain an N/P configurable extended drain metal oxide semiconductor (MOS) transistor, referred to herein as an N/P MOS transistor, which includes an extended drain n-channel MOS (NMOS) transistor in parallel with an extended drain p-channel MOS (PMOS) transistor. The NMOS transistor and PMOS transistor have drift lanes in their respective extended drains which contact each other along a common length. A drain node of the NMOS transistor is coterminous with a source node of the PMOS transistor, and a source node of the NMOS transistor is coterminous with a drain node of the PMOS transistor. The N/P MOS transistor may be operated in an NMOS mode, in which the NMOS transistor is turned on by applying an on-state bias to an NMOS gate, while the PMOS transistor is turned off, by applying an off-state bias to a PMOS gate. The N/P MOS transistor may also be operated in a PMOS mode, in which the PMOS transistor is turned on by applying an on-state bias to the PMOS gate, while the NMOS transistor is turned off, by applying an off-state bias to the NMOS gate. The N/P MOS transistor may further be operated in a dual mode, in which both the NMOS transistor and the PMOS transistor are turned on by applying the on-state biases to the NMOS gate and to the NMOS gate. A total current through the N/P MOS transistor when operated in the dual mode may be greater than a sum of a current when operated in the NMOS mode and a current when operated in the PMOS mode.

Simulating electronic components and electronic circuits is a staple activity of integrated circuit fabricators. It is desirable to accurately estimate parameters such as current in such simulations. It may thus be desirable to provide a simulation of an N/P MOS transistor which predicts a dual mode total current, an NMOS mode current and a PMOS mode current which accurately reflect measured currents in the N/P MOS transistor being simulated.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An N/P MOS transistor includes an extended drain NMOS transistor in parallel with an extended drain PMOS transistor with drift lanes in their respective extended drains which contact each other along a common length. A drain node of the NMOS transistor is coterminous with a source node of the PMOS transistor, and vice versa. An N/P MOS transistor may be modeled as parallel extended drain NMOS and PMOS transistors with coupled npn and pnp bipolar transistors, hereafter referred to a the npn and the pnp, respectively, in the drift lanes. The emitter node of the npn is located in the n-channel drift lane at a point adjacent to the NMOS gate. The base node of the npn is located in the p-channel drift lane adjacent to the npn collector node. The npn emitter node is located in the n-channel drift lane between the NMOS gate and the NMOS drain node. The npn collector node is connected to one end of a n-channel resistor which represents the n-channel drift lane. The other end of the n-channel resistor is connected to the NMOS drain node. The emitter, base and collector nodes of the pnp, and a p-channel resistor, are similarly located, with appropriate changes between the n-channel and p-channel drift lanes. The base node of the npn is connected to the collector node of the pnp, and vice versa.

Simulating the N/P MOS transistor using the model described may estimate a dual mode total current, an NMOS mode current and a PMOS mode current to a desired level of accuracy.

DETAILED DESCRIPTION OF EXAMPLE EMBODIMENTS

Figure 1:
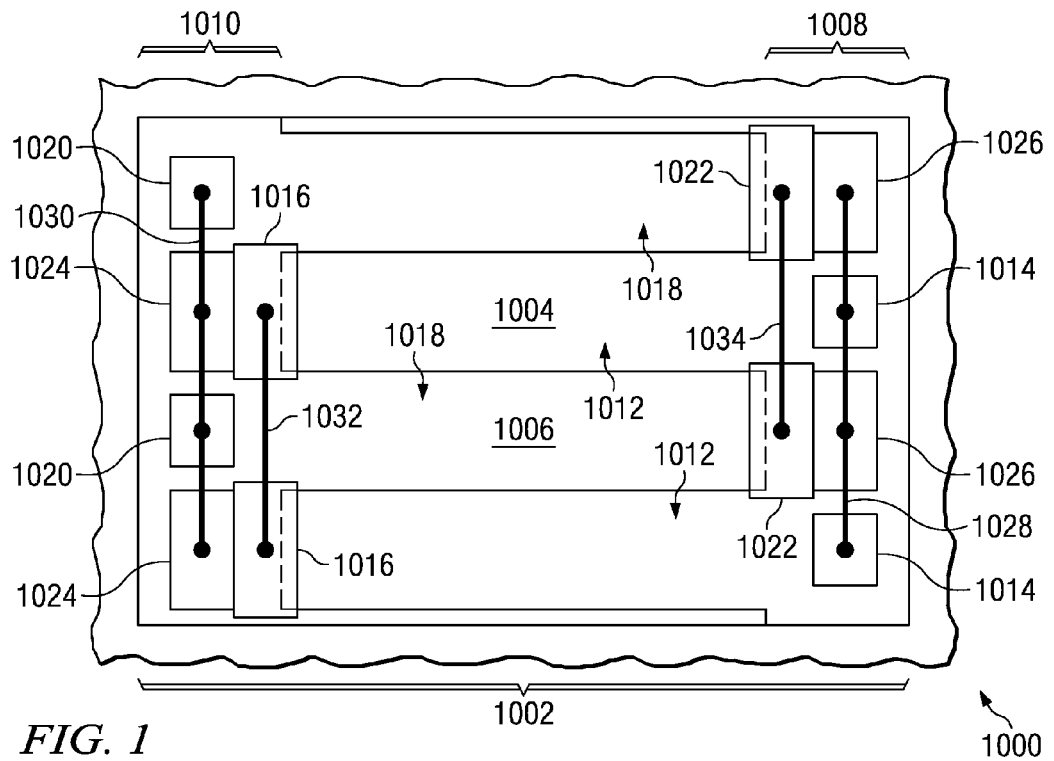
FIG. 1 is a top view of an exemplary embodiment of an N/P MOS transistor.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An N/P configurable extended drain MOS transistor (N/P MOS transistor) includes an extended drain NMOS transistor in parallel with an extended drain PMOS transistor with drift lanes in their respective extended drains which contact each other along a common length. A drain node of the NMOS transistor is coterminous with a source node of the PMOS transistor, and vice versa. An N/P MOS transistor may be modeled as parallel extended drain NMOS and PMOS transistors with coupled npn and pnp bipolar transistors, hereafter referred to as the npn and the pnp, respectively, in the drift lanes. The emitter node of the npn is located in the n-channel drift lane at a point adjacent to the NMOS gate. The base node of the npn is located in the p-channel drift lane adjacent to the npn collector node. The npn emitter node is located in the n-channel drift lane between the NMOS gate and the NMOS drain node. The npn collector node is connected to one end of a n-channel resistor which represents the n-channel drift lane. The other end of the n-channel resistor is connected to the NMOS drain node. The emitter, base and collector nodes of the pnp, and a p-channel resistor, are similarly located, with appropriate changes between the n-channel and p-channel drift lanes. The base node of the npn is connected to the collector node of the pnp, and vice versa. The N/P MOS transistor may be formed for example according to embodiments described in the commonly assigned patent application having application Ser. No. 12/883,726, filed Sep. 16, 2010, which is incorporated herein by reference.

A subcircuit model is described which provides a means for simulating operation of the N/P MOS transistor. By using the model described, a computer system may estimate a dual mode total current, an NMOS mode current and a PMOS mode current to a desired level of accuracy.

For the purposes of this Description, the term "negligible" is understood to mean a sufficiently low magnitude, for example less than 0.1 percent, so as not affect a primary parameter of interest, such as current or voltage, but does not necessarily imply a value of exactly zero. For example, a negligible current through a component would refer to a current which has a magnitude less than 0.1 percent of a total current through a subcircuit containing the component.

FIG. 1 is a top view of an exemplary embodiment of an N/P MOS transistor. An integrated circuit 1000 includes the N/P MOS transistor 1002 which has an n-type region 1004 and a p-type region 1006. The n-type region 1004 includes an re-channel drain/p-channel body area 1008. The p-type region 1006 includes a p-channel drain/n-channel body area 1010. The n-type region 1004 further includes n-channel drift lanes 1012 located between n-type NMOS drain contact diffused regions 1014 in the n-channel drain/p-channel body area 1008 and NMOS gates 1016 located over NMOS channel areas in the p-channel drain/n-channel body area 1010. The p-type region 1006 further includes p-channel drift lanes 1018 located between p-type PMOS drain contact diffused regions 1020 in the p-channel drain/n-channel body area 1010 and PMOS gates 1022 located over PMOS channel areas in the n-channel drain/p-channel body area 1008. N-type NMOS source regions 1024 are located in the p-channel drain/n-channel body area 1010 adjacent to the NMOS gates 1016 opposite the n-channel drift lanes 1012. P-type PMOS source regions 1026 are located in the n-channel drain/ p-channel body area 1008 adjacent to the PMOS gates 1022 opposite the p-channel drift lanes 1018. The NMOS drain contact diffused regions 1014 and the PMOS source regions 1026 are electrically connected, as depicted schematically in FIG. 1 by an upper voltage interconnect 1028. The PMOS drain contact diffused regions 1020 and the NMOS source regions 1024 are electrically connected, as depicted schematically in FIG. 1 by a lower voltage interconnect 1030. The NMOS gates 1016 are electrically connected, as depicted schematically in FIG. 1 by an NMOS gate interconnect 1032. The PMOS gates 1022 are electrically connected, as depicted schematically in FIG. 1 by a PMOS gate interconnect 1034.

During operation of the N/P MOS transistor 1002, the upper voltage interconnect 1028 is biased to an upper bias voltage, for example between 100 and 600 volts above a substrate potential of the integrated circuit 1000. The lower voltage interconnect 1030 is biased to a lower bias voltage which is at a lower potential than the upper bias voltage, for example a potential within a few volts of the substrate potential of the integrated circuit 1000.

In the NMOS mode, the NMOS gate interconnect 1032 is biased to an NMOS on-state potential, for example 5 volts above the lower bias voltage applied to the lower voltage interconnect 1030, and the PMOS gate interconnect 1034 is biased to a PMOS off-state potential, for example the upper bias voltage applied to the upper voltage interconnect 1028. In the NMOS mode, current flows sequentially from the upper voltage interconnect 1028 through the NMOS drain contact diffused regions 1014, through the n-channel drift lanes 1012, through the NMOS channel areas under the NMOS gate interconnect 1032, through the NMOS source regions 1024 and out the lower voltage interconnect 1030. A majority portion of a potential difference between the upper bias voltage and the lower bias voltage is in the n-channel drift lanes 1012. In the NMOS mode, a negligible amount of current, sometimes referred to as PMOS leakage current, flows through the PMOS source regions 1026 to the p-channel drift lanes 1018.

In the PMOS mode, the PMOS gate interconnect 1034 are biased to a PMOS on-state potential, for example 5 volts below the upper bias voltage applied to the upper voltage interconnect 1028, and the NMOS gate interconnect 1032 are biased to an NMOS off-state potential, for example the lower bias voltage applied to the lower voltage interconnect 1030. In the PMOS mode, current flows sequentially from the upper voltage interconnect 1028 through the PMOS source regions 1026, through the PMOS channel areas under the PMOS gate interconnect 1034, through the p-channel drift lanes 1018, through the PMOS drain contact diffused regions 1020 and out the lower voltage interconnect 1030. A majority portion of the potential difference between the upper bias voltage and the lower bias voltage is in the p-channel drift lanes 1018. In the PMOS mode, a negligible amount of current, sometimes referred to as NMOS leakage current, flows through the n-channel drift lanes 1012 to the NMOS source regions 1024.

Figure 2:
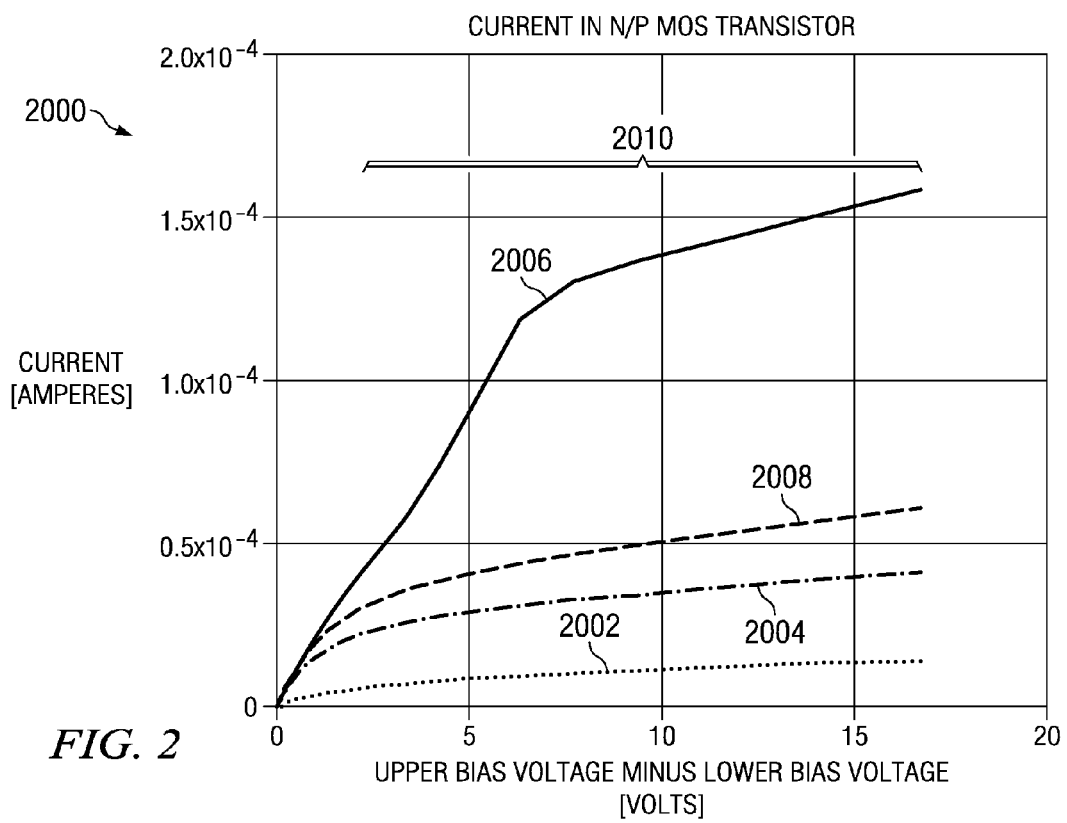
FIG. 2 is a chart of current through an N/P MOS transistor as depicted in FIG. 1 as a function of a potential difference between the upper bias voltage and the lower bias voltage.

In the dual mode, the NMOS gate interconnect 1032 is biased to the NMOS on-state potential and the PMOS gate interconnect 1034 is biased to the PMOS on-state potential. Current flows through the paths recited for the NMOS mode and the PMOS mode. A majority portion of the potential difference between the upper bias voltage and the lower bias voltage is in the n-channel drift lanes 1012 and the p-channel drift lanes 1018. Under some bias conditions, the current in the dual mode is more than 10 percent greater than a sum of the current in the NMOS mode and the current in the PMOS mode, as depicted in FIG. 2. In some instances of the N/P MOS transistor 1002, the dual mode current may be more than twice the sum of the NMOS mode current and the PMOS mode current.

FIG. 2 is a chart of current through an N/P MOS transistor as depicted in FIG. 1 as a function of a potential difference between the upper bias voltage and the lower bias voltage. In the chart 2000, values of the potential difference between the upper bias voltage and the lower bias voltage are located on the horizontal axis, and values of the current are located on the vertical axis. The chart includes a PMOS mode curve 2002 and an NMOS mode curve 2004. The chart 2000 further includes a dual mode curve 2006. A sum curve 2008 representing a sum of the NMOS mode current and the PMOS mode current is included in the chart 2000 for comparison purposes. Current values in the sum curve 2008 are less than current values in the dual mode curve 2006 in a desired on-state bias range 2010 of the N/P MOS transistor.

It may be desirable to simulate current through an N/P MOS transistor in the NMOS mode, the PMOS mode and the dual mode, for example to estimate performance of an electronic circuit containing the N/P MOS transistor in an integrated circuit. Simulation of the N/P MOS transistor may be accomplished using a subcircuit model of the N/P MOS transistor which references a subcircuit diagram of electronic components such as resistors, MOS transistors, and bipolar junction transistors connected so as to provide a desired representation of the N/P MOS transistor. The subcircuit model of the N/P MOS transistor includes a component model for estimating electrical performance of each of the electronic components in the subcircuit diagram which use specific values of physical parameters of the electronic components, such as physical dimensions, doping levels, resistances, threshold potentials and current gains.

Figure 3:
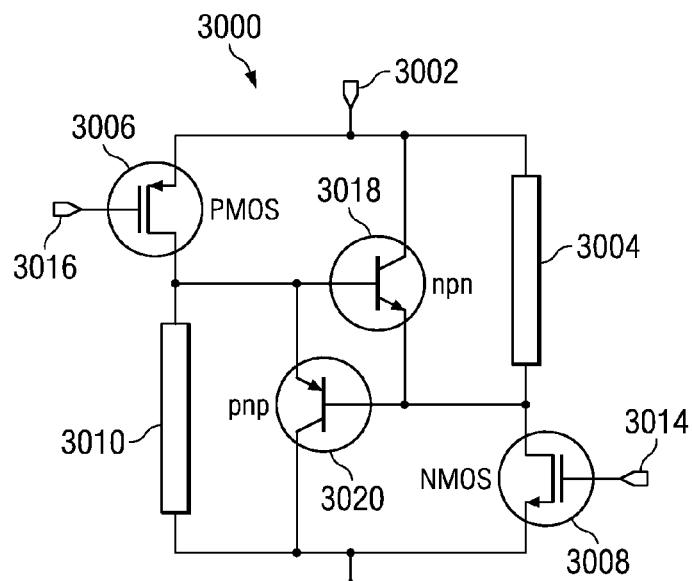
FIG. 3 is a subcircuit diagram for a subcircuit model of the N/P MOS transistor.

FIG. 3 is a subcircuit diagram for a subcircuit model of the N/P MOS transistor. The subcircuit diagram 3000 includes an upper voltage node 3002 connected to a first terminal of an n-type field saturable resistor 3004 and to a source node of a PMOS transistor 3006. A second terminal of the n-type field saturable resistor 3004 is connected to a drain node of an NMOS transistor 3008. A drain node of the PMOS transistor 3006 is connected to a first terminal of a p-type field saturable resistor 3010. A second terminal of the p-type field saturable resistor 3010 and a source node of the NMOS transistor 3008 are connected to a lower voltage node 3012. An NMOS gate node 3014 and a PMOS gate node 3016 are input nodes of the subcircuit model.

The upper voltage node 3002 and the lower voltage node 3012 correspond to the upper voltage interconnect 1028 and the lower voltage interconnect 1030, respectively, of FIG. 1. The n-type field saturable resistor 3004 corresponds to a parallel combination of the n-channel drift lanes 1012 of FIG. 1. The p-type field saturable resistor 3010 corresponds to a parallel combination of the p-channel drift lanes 1018 of FIG. 1. The NMOS transistor 3008 corresponds to a parallel combination of NMOS transistors including the NMOS gates 1016 and the NMOS source regions 1024 of FIG. 1. The PMOS transistor 3006 corresponds to a parallel combination of PMOS transistors including the PMOS gates 1022 and the PMOS source regions 1026 of FIG. 1. The NMOS gate node 3014 and the PMOS gate node 3016 correspond to the NMOS gate interconnect 1032 and the PMOS gate interconnect 1034, respectively, of FIG. 1.

The subcircuit diagram 3000 also includes an npn bipolar transistor 3018 in which a collector node of the npn bipolar transistor 3018 is connected to the upper voltage node 3002, a base node of the npn bipolar transistor 3018 is connected to the drain node of the PMOS transistor 3006, and an emitter node of the npn bipolar transistor 3018 is connected to the drain node of the NMOS transistor 3008. The subcircuit diagram 3000 further includes a pnp bipolar transistor 3020 in which a collector node of the pnp bipolar transistor 3020 is connected to the lower voltage node 3012, a base node of the pnp bipolar transistor 3020 is connected to the drain node of the NMOS transistor 3008, and an emitter node of the pnp bipolar transistor 3020 is connected to the drain node of the PMOS transistor 3006. The npn bipolar transistor 3018 and the pnp bipolar transistor 3020 correspond to current paths through the n-channel drift lanes 1012 and the p-channel drift lanes 1018 of FIG. 1 during operation in the dual mode.

A subcircuit model for estimating electrical performance of the N/P MOS transistor as represented by the subcircuit diagram 3000 includes an NMOS transistor component model for the NMOS transistor 3008 and a PMOS transistor component model for the PMOS transistor 3006. The NMOS transistor component model and the PMOS transistor component model may be, for example, taken or adapted from the BSIM family of MOS transistor models. The subcircuit model of the N/P MOS transistor also includes an npn bipolar transistor component model for the npn bipolar transistor 3018 and a pnp bipolar transistor component model for the pnp bipolar transistor 3020. The npn bipolar transistor component model and the pnp bipolar transistor component model may be, for example based on a Gummel-Poon model or an Ebers-Moll model for bipolar transistors.

Figure 4:
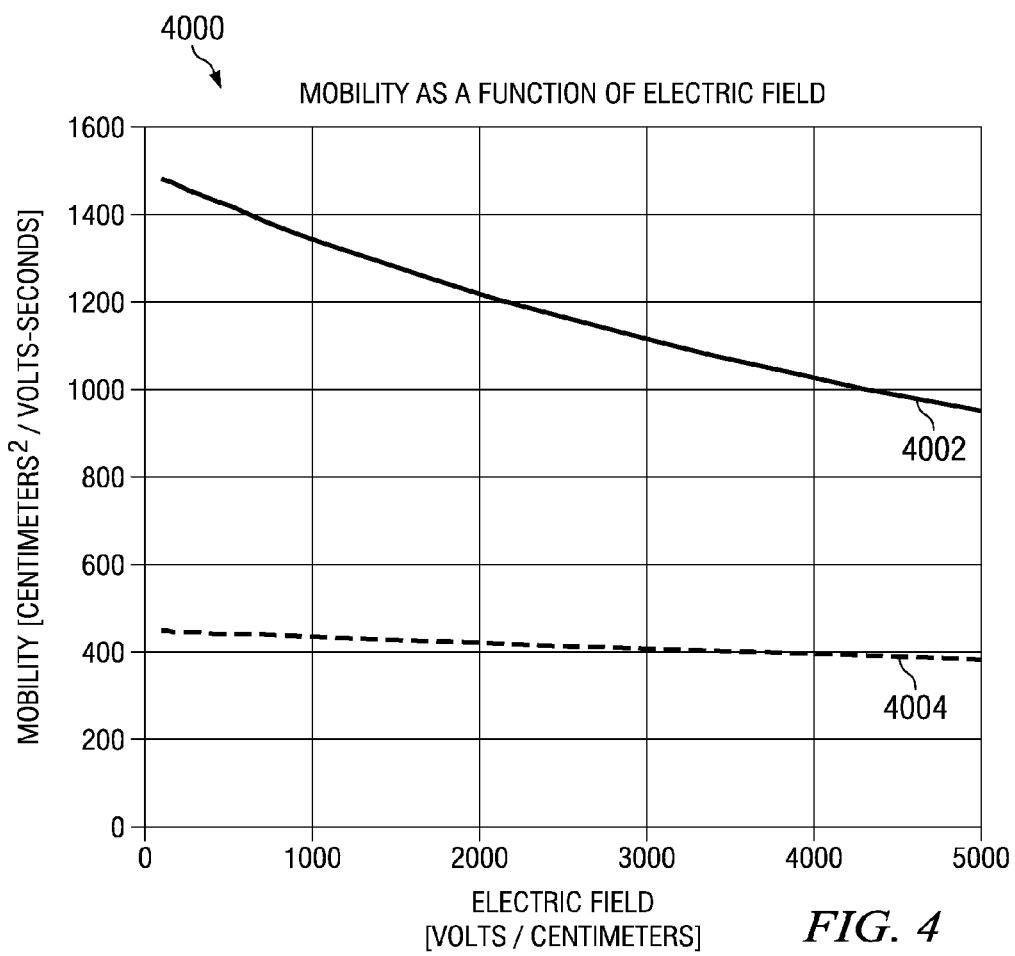
FIG. 4 is a chart of mobility as a function of electric field for the n-channel drift lanes and the p-channel drift lanes of FIG. 1.

The subcircuit model of the N/P MOS transistor further includes an n-type field saturable resistor component model for the n-type field saturable resistor 3004 and a p-type field saturable resistor component model for the p-type field saturable resistor 3010. The n-type field saturable resistor component model and the p-type field saturable resistor component model use physical dimensions and doping density distributions of the n-channel drift lanes 1012 and the p-channel drift lanes 1018, respectively, of FIG. 1. Mobilities of electrons in the n-channel drift lanes 1012 and mobilities of holes in the p-channel drift lanes 1018 are estimated from field saturable mobility relationships such as that depicted in FIG. 4. FIG. 4 is a chart of mobility as a function of electric field for the n-channel drift lanes 1012 and the p-channel drift lanes 1018 of FIG. 1. In the chart 4000, values of the electric field are located on the horizontal axis, and values of the mobility are located on the vertical axis. The chart includes an electron mobility curve 4002 and a hole mobility curve 4004. In each mobility curve, mobility is higher at low values of the electric field and drop significantly for higher values of the electric field.

During operation in the NMOS mode, negligible current flows through the p-type field saturable resistor 3010, so that a potential at the base node of the npn bipolar transistor 3018 is lower than a potential at the emitter node of the npn bipolar transistor 3018. The subcircuit model thus computes current through the npn bipolar transistor 3018 to be negligible. Similarly, the potential at the emitter node of the pnp bipolar transistor 3020 is lower than the potential at the base node of the pnp bipolar transistor 3020, so the subcircuit model computes current through the pnp bipolar transistor 3020 to be negligible.

During operation in the PMOS mode, negligible current flows through the n-type field saturable resistor 3004, so that a potential at the base node of the pnp bipolar transistor 3020 is higher than a potential at the emitter node of the pnp bipolar transistor 3020, and thus the subcircuit model computes current through the pnp bipolar transistor 3020 to be negligible. Similarly, the potential at the emitter node of the npn bipolar transistor 3018 is higher than the potential at the base node of the npn bipolar transistor 3018, so the subcircuit model computes current through the npn bipolar transistor 3018 to be negligible.

During operation in the dual mode, sufficient current flows through both the n-type field saturable resistor 3004 and the p-type field saturable resistor 3010, so that the subcircuit model computes the npn bipolar transistor 3018 and the pnp bipolar transistor 3020 to be biased into linear or saturation modes. Model parameters of the npn bipolar transistor 3018 and the pnp bipolar transistor 3020, such as current gain and series resistance, may be adjusted so that an estimated dual mode current from the subcircuit model matches a measured dual mode current to a desired level of accuracy.

Figure 5:
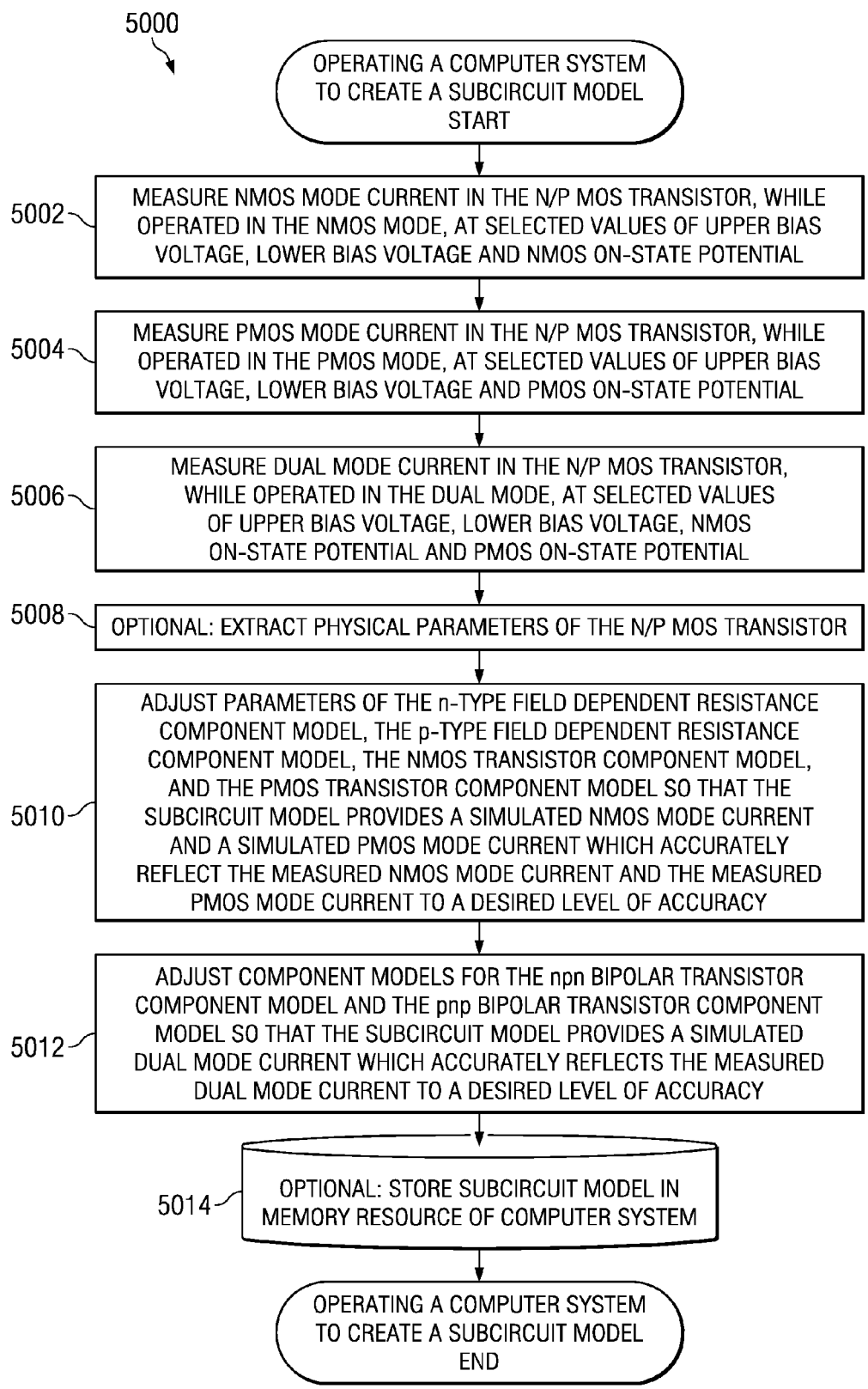
FIG. 5 is a flowchart of an exemplary process for operating a computer system to create a subcircuit model of the N/P MOS transistor.

FIG. 5 is a flowchart of an exemplary process for operating a computer system to create a subcircuit model of the N/P MOS transistor. In one version of the instant embodiment, the computer system may be a dedicated workstation in which all resources such as memory resources, central processing unit, and input/output devices are configured for use by a single user and not shared with other computer systems. In another version, the computer system may be part of a networked set of computer resources, in which a portion or all of the resources are shared between a plurality of users. The process 5000 begins with step 5002 which is to measure NMOS mode current in the N/P MOS transistor, while operated in the NMOS mode, at selected values of upper bias voltage, lower bias voltage and NMOS on-state potential, while maintaining the PMOS off-state potential on the PMOS gate interconnect. For example, the lower bias voltage may be held at one voltage, such as ground, the upper bias voltage may be incremented from the lower bias voltage to a maximum operating voltage of interest, such as a breakdown voltage, and the NMOS on-state potential may be incremented from the lower bias voltage to 5 volts for each value of the upper bias voltage.

Step 5004 is to measure PMOS mode current in the N/P MOS transistor, while operated in the PMOS mode, at selected values of upper bias voltage, lower bias voltage and PMOS on-state potential, while maintaining the NMOS off-state potential on the NMOS gate interconnect. For example, the lower bias voltage may be held at one voltage, such as ground, the upper bias voltage may be incremented from the lower bias voltage to a maximum operating voltage of interest, such as a breakdown voltage, and the PMOS on-state potential may be incremented from the upper bias voltage to 5 volts below the upper bias voltage for each value of the upper bias voltage.

Step 5006 is to measure dual mode current in the N/P MOS transistor, while operated in the dual mode, at selected values of upper bias voltage, lower bias voltage, NMOS on-state potential and PMOS on-state potential. For example, the lower bias voltage may be held at one voltage, such as ground, the upper bias voltage may be incremented from the lower bias voltage to a maximum operating voltage of interest, such as a breakdown voltage, the NMOS on-state potential may be incremented from the lower bias voltage to 5 volts for each value of the upper bias voltage, and the PMOS on-state potential may be incremented from the upper bias voltage to 5 volts below the upper bias voltage for each value of the upper bias voltage.

Optional step 5008 may be executed, which is to extract physical parameters of the N/P MOS transistor. Physical parameters may include dimensions and doping density distributions of the n-channel drift lanes 1012 and the p-channel drift lanes 1018, dimensions and threshold potentials of the parallel combination of the NMOS transistors including the NMOS gates 1016 and the NMOS source regions 1024, and dimensions and threshold potentials of the a parallel combination of PMOS transistors including the PMOS gates 1022 and the PMOS source regions 1026. The physical parameters may be extracted, for example, by electrical measurements, computations, recall of stored data, and/or entry by a person. Steps 5002, 5004, 5006 and 5008 may be performed in any order. The physical parameters may be used to adjust component models for the n-type field saturable resistor component model for the n-type field saturable resistor 3004, for the p-type field saturable resistor component model for the p-type field saturable resistor 3010, for the NMOS transistor component model for the NMOS transistor 3008, and for the PMOS transistor component model for the PMOS transistor 3006.

Step 5010 is to adjust parameters of the n-type field saturable resistor component model for the n-type field saturable resistor 3004, the p-type field saturable resistor component model for the p-type field saturable resistor 3010, the NMOS transistor component model for the NMOS transistor 3008, and the PMOS transistor component model for the PMOS transistor 3006, so that the subcircuit model provides a simulated NMOS mode current and a simulated PMOS mode current which accurately reflect the measured NMOS mode current and a measured PMOS mode current to a desired level of accuracy.

Step 5012 is to adjust parameters of component models for component models of the npn bipolar transistor 3018 and the pnp bipolar transistor 3020 so that the subcircuit model provides a simulated dual mode current which accurately reflects the measured dual mode current to a desired level of accuracy. The adjusted parameters may include current gains and series resistances.

Subsequent to execution of step 5012, optional step 5014 may be executed, which is to store the subcircuit model in a memory resource of the computer system.

Figure 6:
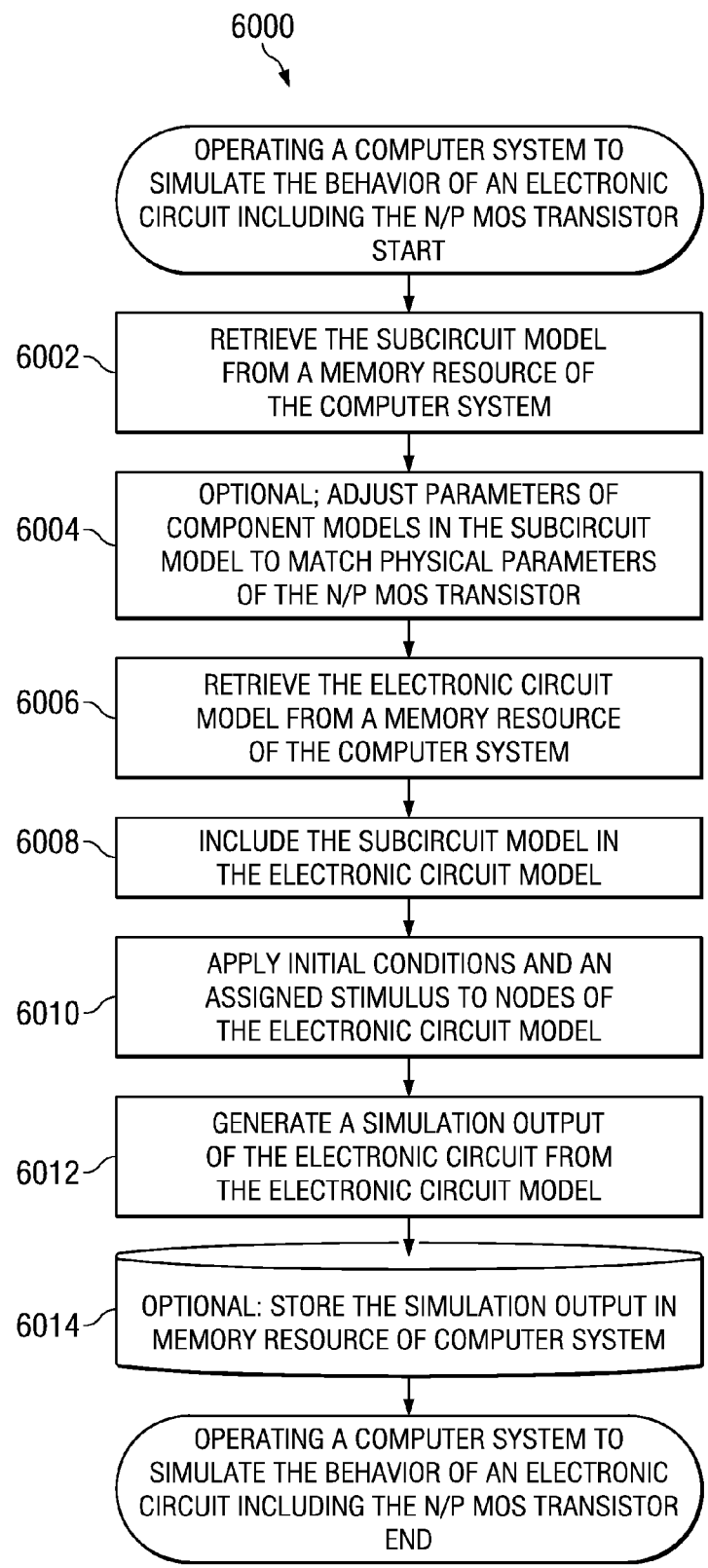
FIG. 6 is a flowchart of an exemplary process for operating a computer system to simulate the behavior of an electronic circuit including the N/P MOS transistor.

FIG. 6 is a flowchart of an exemplary process for operating a computer system to simulate the behavior of an electronic circuit including the N/P MOS transistor. The process 6000 begins with step 6002 which is to retrieve the subcircuit model from a memory resource of the computer system. Subsequent to execution of step 6002 optional step 6004 may be executed, which is to adjust parameters of component models in the subcircuit model to reflect physical parameters of the N/P MOS transistor. for example, dimensions used in the n-type field saturable resistor component model, the p-type field saturable resistor component model, the NMOS transistor component model, and the PMOS transistor component model may be adjusted to reflect dimensions of the specific instance of the N/P MOS transistor being simulated.

Step 6006 is to retrieve an electronic circuit model of the electronic circuit being simulated from a memory resource of the computer system. Subsequent to execution of step 6006, step 6008 is executed which is to include the subcircuit model of the N/P MOS transistor in the electronic circuit model.

Figure 7:
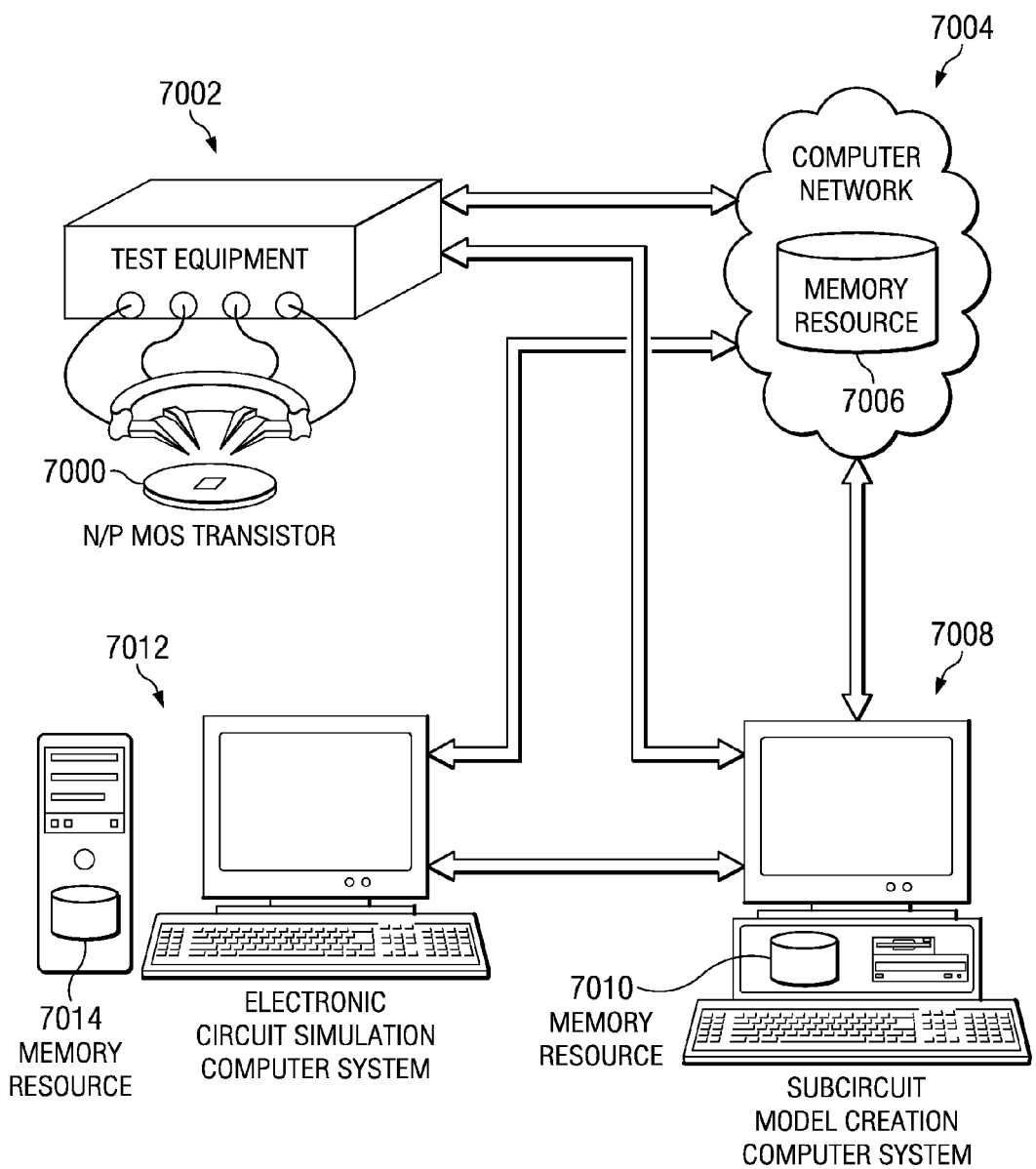
FIG. 7 is a diagram of a computer system which may be used to create a subcircuit model of the N/P MOS transistor and to simulate the behavior of an electronic circuit containing the N/P MOS transistor using the subcircuit model.

Subsequently, step 6010 is to apply initial conditions and an assigned stimulus to nodes of the electronic circuit model. Subsequently, step 6012 is to generate a simulation output of the electronic circuit from the electronic circuit model. Subsequent to step 6012, optional step 6014 may be executed, which is to store the simulation output in memory resource of computer system FIG. 7 is a diagram of a computer system which may be used to create a subcircuit model of the N/P MOS transistor and to simulate the behavior of an electronic circuit containing the N/P MOS transistor using the subcircuit model. An instance of the N/P MOS transistor 7000, for example in an integrated circuit wafer as depicted in FIG. 7, may be tested by test equipment 7002. The test equipment 7002 may be connected to a computer network 7004 which may have a shared memory resource 7006 including a computer readable medium. The test equipment 7002 may provide test data on the N/P MOS transistor 7000 to the computer network 7004 and possibly to the computer readable medium in the computer network shared memory resource 7006. A subcircuit model creation computer system 7008, such as that described in reference to FIG. 5, may be connected to the computer network 7004 or may be directly connected to the test equipment 7002. The subcircuit model creation computer system 7008 may receive test data on the N/P MOS transistor 7000 from the computer readable medium in the computer network shared memory resource 7006 or from the test equipment 7002. A subcircuit model for the N/P MOS transistor may be stored in the computer readable medium in the computer network shared memory resource 7006 or in a computer readable medium in a local memory resource 7010 of the subcircuit model creation computer system 7008. An electronic circuit simulation computer system 7012, such as that described in reference to FIG. 6, may be connected to the computer network 7004 or may be directly connected to the subcircuit model creation computer system 7008. The electronic circuit simulation computer system 7012 may receive the subcircuit model for the N/P MOS transistor from the computer readable medium in the computer network shared memory resource 7006 or from the computer readable medium in the subcircuit model creation computer system 7008. Simulation output for an electronic circuit containing the N/P MOS transistor generated by the electronic circuit simulation computer system 7012 may be stored in the computer readable medium in the computer network shared memory resource 7006 or in a computer readable medium in a local memory resource 7014 of the electronic circuit simulation computer system 7012.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A process of operating a computer system to create a subcircuit model of an N/P configurable extended drain metal oxide semiconductor transistor (N/P MOS transistor) for use in a computerized simulation of an electronic circuit including said N/P MOS transistor, said N/P MOS transistor having an upper voltage interconnect, a lower voltage interconnect, an n-channel metal oxide semiconductor (NMOS) gate interconnect and a p-channel metal oxide semiconductor (PMOS) gate interconnect, comprising steps:

measuring NMOS mode current in said N/P MOS transistor, while operated in an NMOS mode, at selected values of upper bias voltage applied to said upper voltage interconnect, lower bias voltage applied to said lower voltage interconnect, and NMOS on-state potential applied to said NMOS gate interconnect, while maintaining a PMOS off-state potential applied to said PMOS gate interconnect;

measuring PMOS mode current in said N/P MOS transistor, while operated in an PMOS mode, at selected values of upper bias voltage applied to said upper voltage interconnect, lower bias voltage applied to said lower voltage interconnect, and PMOS on-state potential applied to said PMOS gate interconnect, while maintaining an NMOS off-state potential applied to said NMOS gate interconnect;

measuring dual mode current in said N/P MOS transistor, while operated in an dual mode, at selected values of upper bias voltage applied to said upper voltage interconnect, lower bias voltage applied to said lower voltage interconnect, NMOS on-state potential applied to said NMOS gate interconnect, and PMOS on-state potential applied to said PMOS gate interconnect;

extracting physical parameters of said N/P MOS transistor;

adjusting parameters of an n-type field saturable resistor component model of said subcircuit model, of a p-type field saturable resistor component model of said subcircuit model, of an NMOS transistor component model of said subcircuit model, and of a PMOS transistor component model of said subcircuit model, said subcircuit model being referenced to a subcircuit diagram in which:

said subcircuit diagram includes an upper voltage node corresponding to said upper voltage interconnect of said N/P MOS transistor;

said subcircuit diagram includes a lower voltage node corresponding to said lower voltage interconnect of said N/P MOS transistor;

said subcircuit diagram includes an n-type field saturable resistor corresponding to a parallel combination of n-channel drift lanes of said N/P MOS transistor, said n-type field saturable resistor being modeled by said n-type field saturable resistor component model, such that a first terminal of said n-type field saturable resistor is connected to said upper voltage node of said subcircuit diagram;

said subcircuit diagram includes an NMOS transistor corresponding to a parallel combination of NMOS transistors of said N/P MOS transistor, said NMOS transistor being modeled by said NMOS transistor component model, such that a drain node of said NMOS transistor is connected to a second terminal of said n-type field saturable resistor, a source node of said NMOS transistor is connected to said lower voltage node, and a gate node of said NMOS transistor is an NMOS gate input node of said subcircuit diagram;

said subcircuit diagram includes a p-type field saturable resistor corresponding to a parallel combination of p-channel drift lanes of said N/P MOS transistor, said p-type field saturable resistor being modeled by said p-type field saturable resistor component model, such that a first terminal of said p-type field saturable resistor is connected to said lower voltage node of said subcircuit diagram; and said subcircuit diagram includes a PMOS transistor corresponding to a parallel combination of PMOS transistors of said N/P MOS transistor, said PMOS transistor being modeled by said PMOS transistor component model, such that a drain node of said PMOS transistor is connected to a second terminal of said p-type field saturable resistor, a source node of said PMOS transistor is connected to said upper voltage node, and a gate node of said PMOS transistor is a PMOS gate input node of said subcircuit diagram;

so that said subcircuit model provides a simulated NMOS mode current and a simulated PMOS mode current which reflect said measured NMOS mode current and said measured PMOS mode current, respectively, to a desired level of accuracy;

adjusting parameters of an npn bipolar transistor component model of said subcircuit model, and a pnp bipolar transistor component model of said subcircuit model, by which:

said subcircuit diagram includes an npn bipolar transistor corresponding to current paths through said n-channel drift lanes and said p-channel drift lanes during said dual mode, said npn bipolar transistor being modeled by said npn bipolar transistor component model, such that a collector node of said npn bipolar transistor is connected to said upper voltage node, a base node of said npn bipolar transistor is connected to said drain node of said PMOS transistor, and an emitter node of said npn bipolar transistor is connected to said drain node of said NMOS transistor; and said subcircuit diagram includes an pnp bipolar transistor corresponding to current paths through said n-channel drift lanes and said p-channel drift lanes during said dual mode, said pnp bipolar transistor being modeled by said pnp bipolar transistor component model, such that a collector node of said pnp bipolar transistor is connected to said lower voltage node, a base node of said pnp bipolar transistor is connected to said drain node of said NMOS transistor, and an emitter node of said pnp bipolar transistor is connected to said drain node of said PMOS transistor;

so that said subcircuit model provides a simulated dual mode current which reflects said measured dual mode current to a desired level of accuracy.

2. The process of claim 1, including extracting physical parameters of said N/P MOS transistor, performed prior to said step of adjusting parameters of said n-type field saturable resistor component model, of said p-type field saturable resistor component model, of said NMOS transistor component model, and of said PMOS transistor component model of said subcircuit model.

3. The process of claim 1, including storing said subcircuit model in a memory resource of said computer system, performed after said step of adjusting parameters of said npn bipolar transistor component model, and of said pnp bipolar transistor component model.

4. The process of claim 1, in which said npn bipolar transistor component model and said pnp bipolar transistor component model are based on a Gummel-Poon model for a bipolar transistor.

5. The process of claim 1, in which said npn bipolar transistor component model and said pnp bipolar transistor component model are based on a Ebers-Moll model for a bipolar transistor.

6. A process of operating a computer system to simulate the behavior of an electronic circuit including a N/P MOS transistor, said N/P MOS transistor having an upper voltage interconnect, a lower voltage interconnect, an NMOS gate interconnect and a PMOS gate interconnect, comprising steps:

retrieving a subcircuit model for said N/P MOS transistor from a memory resource of said computer system, said subcircuit model being referenced to a subcircuit diagram in which:

said subcircuit diagram includes an upper voltage node corresponding to said upper voltage interconnect of said N/P MOS transistor;

said subcircuit diagram includes a lower voltage node corresponding to said lower voltage interconnect of said N/P MOS transistor;

said subcircuit diagram includes an n-type field saturable resistor corresponding to a parallel combination of n-channel drift lanes of said N/P MOS transistor, such that a first terminal of said n-type field saturable resistor is connected to said upper voltage node of said subcircuit diagram;

said subcircuit diagram includes an NMOS transistor corresponding to a parallel combination of NMOS transistors of said N/P MOS transistor, such that a drain node of said NMOS transistor is connected to a second terminal of said n-type field saturable resistor, a source node of said NMOS transistor is connected to said lower voltage node, and a gate node of said NMOS transistor is an NMOS gate input node of said subcircuit diagram;

said subcircuit diagram includes a p-type field saturable resistor corresponding to a parallel combination of p-channel drift lanes of said N/P MOS transistor, such that a first terminal of said p-type field saturable resistor is connected to said lower voltage node of said subcircuit diagram;

said subcircuit diagram includes a PMOS transistor corresponding to a parallel combination of PMOS transistors of said N/P MOS transistor, such that a drain node of said PMOS transistor is connected to a second terminal of said p-type field saturable resistor, a source node of said PMOS transistor is connected to said upper voltage node, and a gate node of said PMOS transistor is a PMOS gate input node of said subcircuit diagram;

said subcircuit diagram includes an npn bipolar transistor corresponding to current paths through said n-channel drift lanes and said p-channel drift lanes during said dual mode, such that a collector node of said npn bipolar transistor is connected to said upper voltage node, a base node of said npn bipolar transistor is connected to said drain node of said PMOS transistor, and an emitter node of said npn bipolar transistor is connected to said drain node of said NMOS transistor; and said subcircuit diagram includes an pnp bipolar transistor corresponding to current paths through said n-channel drift lanes and said p-channel drift lanes during said dual mode, such that a collector node of said pnp bipolar transistor is connected to said lower voltage node, a base node of said pnp bipolar transistor is connected to said drain node of said NMOS transistor, and an emitter node of said pnp bipolar transistor is connected to said drain node of said PMOS transistor;

such that:
said n-type field saturable resistor is modeled by an n-type field saturable resistor component model of said subcircuit model;
said NMOS transistor is modeled by an NMOS transistor component model of said subcircuit model,
said p-type field saturable resistor is modeled by a p-type field saturable resistor component model of said subcircuit model;
said PMOS transistor is modeled by a PMOS transistor component model of said subcircuit model;
said npn bipolar transistor is modeled by an npn bipolar transistor component model of said subcircuit model; and
said pnp bipolar transistor is modeled by a pnp bipolar transistor component model of said subcircuit model;

retrieving an electronic circuit model for said electronic circuit from a memory resource of said computer system;

including said subcircuit model in said electronic circuit model;
applying initial conditions and an assigned stimulus to nodes of said electronic circuit model; and
generating a simulation output of said electronic circuit from said electronic circuit model.

7. The process of claim 6, including adjusting parameters of said subcircuit model to reflect physical parameters of said N/P MOS transistor, performed prior to said step of applying initial conditions and an assigned stimulus to nodes of said electronic circuit model.

8. The process of claim 6, including storing said simulation output in a memory resource of said computer system, performed after said step of generating said simulation output of said electronic circuit.

9. The process of claim 6, in which said npn bipolar transistor component model and said pnp bipolar transistor component model are based on a Gummel-Poon model for a bipolar transistor.

10. The process of claim 6, in which said npn bipolar transistor component model and said pnp bipolar transistor component model are based on a Ebers-Moll model for a bipolar transistor.

11. A computer readable medium storing a computer program that, when executed on a computer system, causes the computer system to perform a sequence of operations for simulating the behavior of an electronic circuit including a N/P MOS transistor, the sequence of operations comprising:
retrieving a subcircuit model for said N/P MOS transistor from a memory resource of said computer system, said subcircuit model being referenced to a subcircuit diagram in which:
said subcircuit diagram includes an upper voltage node corresponding to said upper voltage interconnect of said N/P MOS transistor;
said subcircuit diagram includes a lower voltage node corresponding to said lower voltage interconnect of said N/P MOS transistor;
said subcircuit diagram includes an n-type field saturable resistor corresponding to a parallel combination of n-channel drift lanes of said N/P MOS transistor, such that a first terminal of said n-type field saturable resistor is connected to said upper voltage node of said subcircuit diagram;
said subcircuit diagram includes an NMOS transistor corresponding to a parallel combination of NMOS transistors of said N/P MOS transistor, such that a drain node of said NMOS transistor is connected to a second terminal of said n-type field saturable resistor, a source node of said NMOS transistor is connected to said lower voltage node, and a gate node of said NMOS transistor is an NMOS gate input node of said subcircuit diagram;
said subcircuit diagram includes a p-type field saturable resistor corresponding to a parallel combination of p-channel drift lanes of said N/P MOS transistor, such that a first terminal of said p-type field saturable resistor is connected to said lower voltage node of said subcircuit diagram;
said subcircuit diagram includes a PMOS transistor corresponding to a parallel combination of PMOS transistors of said N/P MOS transistor, such that a drain node of said PMOS transistor is connected to a second terminal of said p-type field saturable resistor, a source node of said PMOS transistor is connected to said upper voltage node, and a gate node of said PMOS transistor is a PMOS gate input node of said subcircuit diagram;
said subcircuit diagram includes an npn bipolar transistor corresponding to current paths through said n-channel drift lanes and said p-channel drift lanes during said dual mode, such that a collector node of said npn bipolar transistor is connected to said upper voltage node, a base node of said npn bipolar transistor is connected to said drain node of said PMOS transistor, and an emitter node of said npn bipolar transistor is connected to said drain node of said NMOS transistor; and
said subcircuit diagram includes an pnp bipolar transistor corresponding to current paths through said n-channel drift lanes and said p-channel drift lanes during said dual mode, such that a collector node of said pnp bipolar transistor is connected to said lower voltage node, a base node of said pnp bipolar transistor is connected to said drain node of said NMOS transistor, and an emitter node of said pnp bipolar transistor is connected to said drain node of said PMOS transistor;
such that:
said n-type field saturable resistor is modeled by an n-type field saturable resistor component model of said subcircuit model;
said NMOS transistor is modeled by an NMOS transistor component model of said subcircuit model,
said p-type field saturable resistor is modeled by a p-type field saturable resistor component model of said subcircuit model;
said PMOS transistor is modeled by a PMOS transistor component model of said subcircuit model;
said npn bipolar transistor is modeled by an npn bipolar transistor component model of said subcircuit model; and
said pnp bipolar transistor is modeled by a pnp bipolar transistor component model of said subcircuit model;
retrieving an electronic circuit model for said electronic circuit from a memory resource of said computer system;
including said subcircuit model in said electronic circuit model;
applying initial conditions and an assigned stimulus to nodes of said electronic circuit model; and
generating a simulation output of said electronic circuit from said electronic circuit model.

12. The computer readable medium of claim 11, in which said sequence of operations includes adjusting parameters of said subcircuit model to reflect physical parameters of said N/P MOS transistor, performed prior to said step of applying initial conditions and an assigned stimulus to nodes of said electronic circuit model.

13. The computer readable medium of claim 11, in which said sequence of operations includes storing said simulation output in a memory resource of said computer system, performed after said step of generating said simulation output of said electronic circuit.

14. The computer readable medium of claim 11, in which said npn bipolar transistor component model and said pnp bipolar transistor component model are based on a Gummel-Poon model for a bipolar transistor.

15. The computer readable medium of claim 11, in which said npn bipolar transistor component model and said pnp bipolar transistor component model are based on a Ebers-Moll model for a bipolar transistor.

* * * * *